United States Patent
Banin et al.

(10) Patent No.: US 9,927,775 B1
(45) Date of Patent: Mar. 27, 2018

(54) BINARY STOCHASTIC TIME-TO-DIGITAL CONVERTER AND METHOD

(71) Applicant: Intel Corporation, Santa Clara, CA (US)

(72) Inventors: Rotem Banin, Pardes-Hana (IL); Assaf Ben-Bassat, Haifa (IL); Evgeny Shumaker, Nesher (IL); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/477,057

(22) Filed: Apr. 1, 2017

(51) Int. Cl.
   *H03M 1/50* (2006.01)
   *G04F 10/00* (2006.01)
   *H03M 1/04* (2006.01)
   *H03K 3/037* (2006.01)
   *H03K 19/23* (2006.01)

(52) U.S. Cl.
   CPC .......... *G04F 10/005* (2013.01); *H03K 3/037* (2013.01); *H03K 19/23* (2013.01); *H03M 1/04* (2013.01)

(58) Field of Classification Search
   CPC ......... H03M 1/04; H03M 1/00; G04F 10/005; H03K 19/23; H03K 3/037
   USPC .............................................. 341/166, 50, 51
   See application file for complete search history.

(56) References Cited

U.S. PATENT DOCUMENTS

| | | | | |
|---|---|---|---|---|
| 5,942,937 A * | 8/1999 | Bell | .......................... | H03K 5/08 327/270 |
| 6,118,297 A * | 9/2000 | Schenck | ................. | H03K 19/23 326/11 |
| 8,825,424 B2 * | 9/2014 | Rivoir | ................... | G04F 10/005 327/12 |

* cited by examiner

*Primary Examiner* — Jean B Jeanglaude
(74) *Attorney, Agent, or Firm* — Schiff Hardin LLP

(57) ABSTRACT

A method and apparatus for determining a difference between signal edges in two signals includes a multiple stage converter where each stage determines which of the two signals has an earlier signal edge, outputs a value corresponding to that determination, and then applies a delay to the earlier signal that is equal to half of the delay applied by the next previous stage. The stages examine smaller and smaller intervals to the sought-after signal edge. Each stage includes a plurality of logic elements. If all logic elements in the stage output the same signal, the edge position is clear. If some of the logic elements in the stage vote differently than others in the state due to differences in setup time for the different elements, the edge location has been found within the sensing band of the stage.

20 Claims, 9 Drawing Sheets

BINARY STOCHASTIC TIME-TO-DIGITAL CONVERTER AND METHOD

TECHNICAL FIELD

The present disclosure relates generally to a method and apparatus for converting time to a digital value, and more particularly to a method and apparatus for determining a time difference between two signals as a digital value.

BACKGROUND

Time-to-digital converters (TDC) are used in a majority of Digital Phase Locked Loop architectures to quantify the phase distance between two signals, the high frequency local oscillator signal (usually produced by a voltage controlled oscillator (VCO)) and a lower frequency reference clock signal (almost always a signal from a crystal-based oscillator). Quantization error in the converter introduces noise into the process that is directly proportional to the quantization error. Minimizing the quantization error is important to attain low in-band phase noise. A good rule of thumb in this regard would be that the quantization resolution should be lower than the close-in phase noise level of the reference (REF) clock signal. On other hand, the quantifier (or TDC) should feature a sufficiently large dynamic range, which should extend to more than one period at a lowest required VCO output frequency (over any process and any environment variations, of course).

A straight-forward approach that is employed in the industry due to its relative simplicity is use of a Flash-TDC, which utilizes several sampling elements that are equal in number to the number of quantization levels. For a system that has a large dynamic range and a fine resolution (which is required to adhere to perspective wireless radio standards), a large ensemble of sampling elements is required. A plethora of design problems often stems from the use of a large ensemble, ranging from the large chip area occupied by the device to high peak-power consumption profiles of the device. Such a large sampling ensemble device produces current spikes as a result of its power consumption. The current spikes are especially difficult to accommodate and mask, for example, to restrict the spikes from introducing a significant change in the supply voltage. It's for that reason that the signature of the TDC sampling operation is well felt all over the integrated circuit in form of spurious signals that plague both the transmit and receive chains.

Two alternative approaches to increasing the size of the sampling ensembles to obtain increased dynamic range have been presented in the literature. The first approach implements the idea of element reuse, turning the linear delay line of the TDC into a ring—hence its name (R)ing-TDC. A Ring-TDC is particularly cumbersome to design in terms of timing scheme and decoding mechanism plus it has a higher 1/f noise content, but a Ring-TDC does allow for considerable savings in terms of sampling ensemble size. The second approach introduces the idea of phase prediction for which the edge of the VCO signal is localized by prediction and is juxtaposed to a properly delayed replica of the reference signal. This scheme is however sensitive to the prediction quality and requires cumbersome calibration in order to cancel out the integrated non-linearity inherent with every TDC.

DETAILED DESCRIPTION

Figure 1:
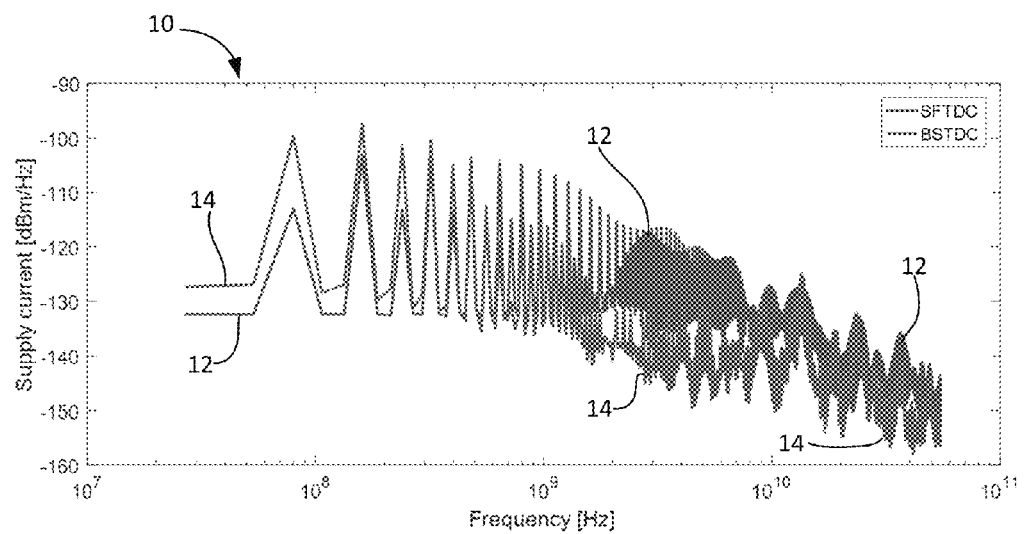
FIG. 1 is a graph of a power spectral density curve of a supply current to a stochastic flash time-to-digital converter compared to a power spectral density curve of the supply current to a binary stochastic time-to-digital converter.

In the present specification, a time-to-digital converter is described which may be referred to as a binary stochastic time-to-digital converter.

A main principle of operation for the binary stochastic time-to-digital converter is that a successive approximation is performed to narrow down a distance (or more specifically a time) between transition edges (either a transition of up to down or a transition of down to up) of two respective signals. The two signals are provided to a multiple stage converter. The first stage of the converter determines which of the two signals has an earlier transition edge. The stage applies a delay to the signal with the earlier transition edge, also referred to as the signal having precedence. Both signals are output to a next following stage. The output signals include the signal that has been determined to have precedence to which the delay has been applied by the stage and the other signal without a delay.

The delay that is applied only to the earlier of the two signals will either bring the signal edges of the two signals closer to one another or will reverse the order of the signal edges so that the signal that previously had the earlier edge now has a later edge as a result of the applied delay.

The next stage receives the two signals, one of which has been delayed by the prior stage. This next stage determines which of the two signals has precedence, in other words which has the earlier occurring signal edge. The determination of precedence may determine that the same signal is earlier as the prior stage or may determine that the other signal is earlier if the delay resulted in the signal order being reversed. Once the determination is made as to which signal has the earlier edge at this stage, a delay is applied by this stage to the signal with the earlier edge. The delay applied by this stage is one half of the delay that was applied by the prior stage.

At each stage subsequent stage of the multistage converter, a determination is made as to which signal has the earlier transition edge. A delay is added to the signal with the earlier edge as determined by the respective stage. At each stage in the sequence, the delay is scaled by half. By applying delays at each stage that are one half of the delay that was applied at the immediately prior stage, the signal edges converge.

The edge precedence determinate is output by each stage and used to generate a value that indicates the time difference between the signals provided to the converter. Since each stage scales the interval being examined by half, the output of the stages may be used to generate a binary value with the most significant bit coming from the first stage, the least significant bit from the last stage in the sequence, and the bits in between being generated by the respective stages between the first and last stages. For example, a seven stage converter may generate a seven bit binary value indicating the time difference.

In an illustrated example, four stages may be provided in the multi-stage converter. In another illustrated example, a seven stage converter is provided. Other examples of a multiple stage converter may have five stages, eight stages, nine stages, or some other number of stages.

In certain examples, the two signals to be examined by the multiple stage converter may include a reference (REF) signal and a voltage controlled oscillator (VCO) signal. For example, the converter may determine a time difference between a sampling edge of the reference signal and one transition edge of a VCO (voltage controlled oscillator) signal. The binary stochastic time-to-digital converter may be used to measure time differences between other signals as well. The signals being examined by the binary stochastic time-to-digital converter may be repeating signals or non-repeating signals.

Since time only moves in one direction and signals can only be delayed and not advanced, each stage adds it's delay to the signal having the earlier occurring edge. By making the delays applied by each sequential stage progressively smaller, each stage examines smaller and smaller time differences. The effect is that smaller and smaller intervals are examined at each successive stage In certain embodiments, the delays are successively binary scaled. In other words, each delay may be one half of the delay applied by the previous stage. The determination of each stage may be provided as a bit in a binary number representing the measured difference. The delay is applied on the earlier occurring edge so that eventually the distance is constrained to within the smallest delay. The subsequent stages can quantize at most the delay introduced by the current stage (the sum of delays at subsequent stages is one LSB (less significant bit) smaller than the delay at the current stage—that is precisely the binary nature of the converter.

The decision being made at each stage as to which signal has the precedence is provided, according to certain aspects, by an ensemble of sampling elements within the stage to which the two signals are supplied. Each sampling element in the ensemble makes a determination as to which signal transition is earlier. If the time difference between the signal transitions is relatively large, all of the sampling elements in the ensemble will have the same result. If the time difference is smaller, the sampling elements may produce different results. Some of the sampling elements within the same ensemble will process the signals faster than others and some are slower to process the signals. The difference in processing times may be the result of different setup times for the different sampling elements. The ensemble of sampling elements therefore defines a time span between the results produced by the faster sampling elements and the results produced by the slower sampling elements. This time span may be referred to as an ensemble sampling time span.

If the sought-after signal transition falls within the ensemble sampling time span, the faster sampling elements will read the signals before the signal transition has occurred and give one result and the slower sampling elements will read the signals after the transition, giving a different result. When this occurs, different outputs are provided from the sampling elements within the ensemble. When the ensemble elements of a stage produce different results due to the differing processing times, the results for the stage may be referred to as stochastic results. The ensemble sampling time span may also be referred to as the sampling moment of the ensemble. The variations in the response times of the sampling elements within the ensemble may be referred to as a natural stochastic spread of the sampling moment.

The output of each sampling element within the ensemble may be considered to be a vote. When the output of the ensemble is stochastic, different elements within the ensemble will have different votes as to which signal has the earlier transition edge. A majority of the votes by the sampling elements in the stage may be calculated. The majority of votes is used in determining which signal is to receive the delay by that stage for transmission to the following stage.

Each stage provides an output that indicates which signal has the earlier transition edge as determined by the stage. In certain aspects, the votes by some or all of the sampling elements are provided as outputs of the stage. Where the votes are different between the sampling elements, in other words, the results of the stage are stochastic, the output from the stage may be a majority of the vote or may be considered as a fraction, proportion, or other partial value represented by the voting. For example, a 2-5 vote may be considered differently than a 3-4 vote or a 5-2 vote. Treatment of outlier votes will be described later in this document.

A sampling ensemble of a stage may have a plurality of sampling elements within the ensemble, for instance, nine sampling elements may be provided in certain aspects. Other numbers of sampling elements are of course possible. An odd number of sampling elements provides a tie breaker in case of a close vote, although this is not required in every instance.

A sampling ensemble may have one or more sampling element members that operate much faster or much slower than the other sampling elements of the ensemble. The outcomes from these sampling elements may consistently disagree with the outcomes of the other elements within the ensemble. These sampling elements may be considered outliers. According to certain aspects, the results of the sampling elements that have been determined to be outliers may be disregarded in the voting. Outlier sampling elements with slower responses than the other elements in the ensemble may be more common than faster outliers.

The outcomes of the sampling elements in the ensemble, minus any elements that have been disregarded as outliers, are collected and the transition edge precedence is decided by a majority vote. The majority vote determines which signal is delayed by that stage. A decoder is employed to cast the recorded information (the decisions by each stage) into a digital code characterizing the time distance between two pre-chosen signal edges.

The binary stochastic time-to-digital converter provides several advantages compared to known converters. For example, a smaller sampling ensemble is required compared to known converters. In certain aspects, the binary stochastic time-to-digital converter may have almost an order of magnitude fewer sampling elements used compared to known converters. Fewer sampling elements means a smaller area of a chip is required for the converter. Fewer sampling elements also means lower peak current consumption. The lower current consumption also means less influence by the converter on the power supply and hence lower occurrence of spurious signal levels in the transmitter signal chains.

Turning to the drawings, FIG. 1 is a graph 10 of supply current over frequency. A first trace 12 shows the power spectral density for the supply current for a stochastic flash time-to-digital converter. For clarity, the reference number 12 indicates multiple locations along the trace 12. A second trace 14, also indicated by several instances of the reference number 14, juxtaposes the power spectral density of the supply current of an example of a binary stochastic time-to-digital converter with that of the flash time-to-digital converter. The graph 10 shows that the spurious signal content across both Wi-Fi bands (2.4 and 5.8 GHz) of the binary stochastic time-to-digital converter is at least 15 dB lower than for the stochastic flash time-to-digital converter.

If it would be desired to increase the dynamic range of the converter over the example shown in the graph 10, for example, by increasing the signal level above the spurious noise levels, this can be accomplished readily in the present aspect. For example, an Increase in the dynamic range of the converter by a factor of two will only require the addition of one more stage to the converter. In known converters using flash-based architecture, a two-fold increase in the dynamic range requires a two-fold increase in the number of sampling elements used in the converter.

Another advantage of the binary stochastic time-to-digital converter is the use of simpler decoder logic. In the binary stochastic time-to-digital converter it is relatively simple to define and meet digital timing constraints. A further advantage is that the binary stochastic time-to-digital converter is suitable for both divider-less and divider-based Phase Locked Loops (PLL) systems.

Figure 2:
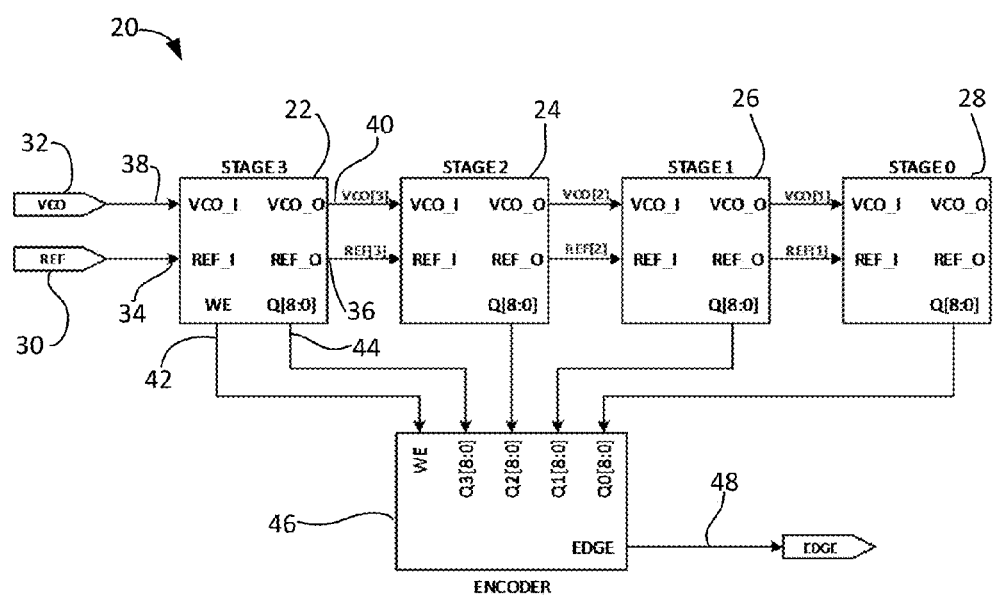
FIG. 2 is a functional block diagram of a four stage binary stochastic time-to-digital converter.

Referring to FIG. 2, an example of a binary stochastic time-to-digital converter 20 includes four sampling stages 22, 24, 26, and 28. The converter 20 is provided with a reference signal 30 and an oscillator signal 32, such as from a voltage controlled oscillator (VCO). The role of each stage 22, 24, 26, and 28 is to bring the sampling edge of the reference signal 30 closer to the desired edge of the VCO signal 32 by applying a binary scaled delay to the signal whose edge occurs earlier. The delay is referred to as a binary scaled delay because each consecutive stage applies half of the delay applied by the previous stage.

FIG. 2 depicts a generalized sampling stage, such as the stage 22, having a reference signal input 34 (labeled in the drawing as REF_I), a reference signal output 36 (labeled as REF_O), an oscillator signal input 38 (labeled as VCO_I), an oscillator signal output 40 (labeled as VCO_O), a wrong edge detector output 42 (labeled as WE), and a stage value output 44 (labeled as Q[8:0]). The first sample stage 22 is labeled Stage 3, the second stage is labeled Stage 2, the third stage is labeled Stage 1, and the fourth stage is labeled Stage 0. The labeling of the stages indicate the most significant bit (MSB) to least significant bit (LSB) of the information provided to the encoder 46. The reference signal 30 and oscillator signal 32 may be referred to as clock signals. The first stage 22 (Stage 3) outputs a processed reference signal REF[3] at the output 36 and a processed oscillator signal VCO[3] at the output 40. The processed reference signal REF[3] and the processed oscillator signal VCO[3] are provided to corresponding inputs of the next stage 24. The two clock signals are forwarded through each n-th stage.

Like the first stage 22, the second stage has a reference signal input labeled REF_I, a reference signal output labeled REF_O, an oscillator signal input labeled VCO_I, an oscillator signal output labeled VCO_O, and a stage output labeled Q[8:0]. Unlike the first stage 22, the second stage 24 need not have a wrong edge output WE. Each subsequent stage 26 and 28 has the same inputs and outputs as the second stage. Further stages may be added or removed, as deleted. The final stage has no following stage so the reference and oscillator outputs of the final stage are not connected to a subsequent stage, and need not be provided.

The stage output values Q[8:0] of each stage and the wrong edge value WE of the first stage are provided to an encoder 46, which generates an encoded output signal labeled EDGE in the figure on output 48. The illustrated example shows a converter having four stages. As noted above, more or fewer stages are possible and within the scope of this improvement.

Figure 3:
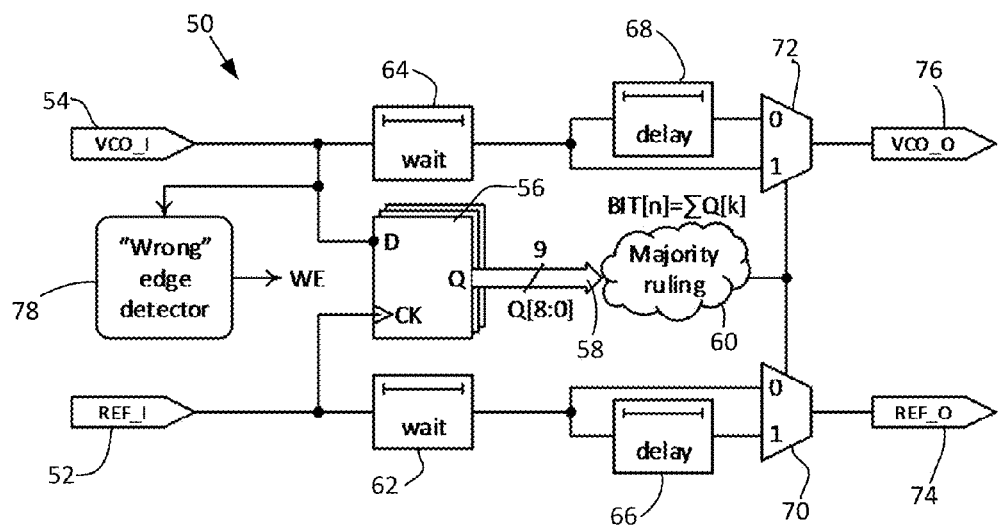
FIG. 3 is a functional block digraph of a sampling stage as may be used in the binary stochastic time-to-digital converter of FIG. 2.

Turning to FIG. 3, a stage 50 is shown in detail. Each of the stages of a multiple stage binary stochastic time-to-digital converter may have a similar configuration, except that only the first stage uses the wrong edge detector and subsequent stages need not have a wrong edge detector. The illustrated example stage 50 includes a reference signal input 52 labeled REF_I and an oscillator signal input 54 labeled VCO_I. The stage 50 includes a plurality of sampling elements 56 in an ensemble. The sampling elements 56 may include logic elements, such as D-type Flip-Flops, with the reference signal REF serving as the sampling signal at the CK input for the logic elements and the oscillator signal VCO being treated as the sampled data at the D input. In an example of the operation of the converter, the logic elements or flip-flops sample at a rising transition of the clock signal, which provides a reference moment for the stage. Each of the logic elements or flip-flops 56 in the stage 50 produces an output value at its respective output Q, which will be denoted as output Q[k], with k indicating the number of the logic element in the ensemble. The outputs of each of the flip flops 56 is provided as an output of the stage to the encoder 46 of FIG. 2. The encoder 46 generates a value to quantize a time distance between the reference moment and a falling edge of the VCO signal. The outputs of the sampling element flip flops 56 might hold stochastic information that is important to achieving a fine quantization.

In the illustrated example, each stage 50 has nine flip-flops or logic elements 56, labeled 0-8, respectively. Other numbers of logic elements within the stages are also possible, including different numbers of logic elements in different stages. The number of flip-flops or logic elements for a stage may be denoted as SFF. The nine logic element outputs 58, which are designated Q[8:0], are processed as indicated at 60 to determine the majority ruling for the plural votes. The majority ruling is used to determine which of the delays of the delay multiplexers will be applied at the end of each stage. The stage 50 includes a wait element 62 to delay the unprocessed reference signal and a wait element 64 to delay the unprocessed oscillator signal while the D flip flops 56 are processing the signals to determine precedence.

A delay element 66 is connected at the output of the wait element 62 to apply a binary scaled time delay to the reference signal if the reference signal is determined to have the earlier edge. The amount of delay time applied by the delay element 66 is set for each stage in the sequence in which the delay element is provided. Longer delay times are used in earlier stages in the sequence and shorter delay times are used in later stages. The delay element 66 is bypassed by a non-delayed reference signal line and both the non-delayed reference signal line and the output of the delay 66 are provided to a data selector or multiplexer 70. The result of the majority ruling calculation 60 of the D flip flops 56 votes is provided to a control input of the data selector or multiplexer 70. The majority vote determines whether the delayed reference signal from the delay element 66 or the non-delayed reference signal from the non-delayed reference signal line is transmitted through the multiplexer 70 as the reference output 74 for the stage 50. The wait element 62 delays the reference signal long enough for the flip flop sampling elements 56 to have completed their determinations and the calculation 60 of majority votes to have been completed and received by the multiplexer 70. For purposes of this disclosure, the non-delayed reference signal refers to the signal without the binary scaled delay 66. A reference signal delayed by the wait element 62 may be considered a non-delayed signal.

Similarly, after the wait element 64, the oscillator signal is delayed by a binary scaled delay element 68. The delay element 68, in certain aspects, applies the same delay time as the delay element 66 for the respective stage 50. The delay element 68 is bypassed by a non-delayed oscillator signal line. Both the delayed and non-delayed oscillator signals are supplied to a data selector or multiplexer 72. The control input for the data selector or multiplexer 72 is connected to the output of the majority ruling 60, which determines whether the binary scaled delayed or non-delayed oscillator signal are transmitted by the multiplexer to be provided as the oscillator output 76 of the stage 50. Similar to above, the wait element 64 delays the oscillator signal until the flip flop elements and voting is completed and multiplexer 72 is ready.

The delay element 66 for the reference signal is connected to the "1" input of the multiplexer 70 whereas the delay element 68 for the oscillator signal is connected to the "0" input of the multiplexer 72. The result is that either the delayed reference signal and the non-delayed oscillator signal will be output from the stage 50, or the non-delayed reference signal and the delayed oscillator signal will be output from the stage 50. For example, if the majority ruling output is a "1", the reference signal that has been delayed by the delay element 66 is output by the multiplexer 70 to the output 74. The "1" majority ruling output will cause the multiplexer 72 to pass the non-delayed oscillator signal to the output 76. A "0" output by the majority ruling 60 will have the opposite result, outputting the delayed the oscillator signal by the delay element 68 and the non-delayed reference signal.

Depending on which signal, either the reference signal or the oscillator signal, is found to have the earlier transition edge, the delay of the delay element 66 or 68 is applied to that earlier signal and the signal with the later transition is not delayed by the stage. If the stage 50 is a second or subsequent stage, either the reference signal or oscillator signal may have been delayed by one or more previous stages, or in some cases both signals may have been delayed by different ones of previous stages. The delay elements 66 and 68 for each stage apply a delay duration which is one half of the delay duration applied by the immediately preceding stage. The reference signal output 74 and the oscillator signal output 76, with the earlier of the two signals being delayed by the duration of the delay elements 66 and 68, are applied to the next stage, if any. The effect is that each stage cuts the interval being examined for the signal transition in half. The interval half not having the sought after signal transition is disregarded by subsequent stages. Once an interval half is determined not to have the signal transition, no further energy is expended nor circuit elements used to examine the interval half.

Each stage is used to determine precedence of one signal over the other. Once the precedence is established, the stage applies a delay that may do one of the following: decrease the time distance between the two edges or reverse the precedence. In the second case, the binary nature of the converter guarantees that subsequent stages will minimize the distance.

If the stage 50 is the first stage in a binary stochastic time-to-digital converter, the stage 50 includes a wrong edge detector 78 that is connected to receive the oscillator signal 54 and to provide a wrong edge signal WE if the wrong edge is detected. In the example, a falling edge of the oscillator signal is the sought after signal edge. The wrong edge detector 78 determines whether a falling edge or a rising edge has been detected and provides the wrong edge signal for a rising signal edge.

Whenever the distance (time) between the sampling edge or reference moment of the REF signal and any of the two edges of the VCO oscillator signal is large, the decision by the stage 50 is clear-cut because all of the flip-flops or logic elements 56 will sample the same data (either a value "0" or "1") and there is no meta-stability in the output signal. It is important to note that the logic elements 56 sample any edge of the oscillator signal 54, not just the desired edge falling edge. The wrong edge detector 78 provides the information on which edge has been detected. An example of a sampling situation (for both "0" and "1" VCO states) is depicted in FIG. 3.

The majority ruling determination for the multiple logic elements 56 is indicated by a function BIT[n] that denotes the sum of outputs of the flip flops at the n-th stage, which is shown as BIT[n]=ΣQ[k]. If in the above example all of the flip flops 56 have sampled "1" and the summation function BIT[n]=9, this means that the desired falling edge of the oscillator signal VCO 54 occurs later in time than the sampling edge of the reference signal REF 52. Actually, the output is not dependent on the location of the sampling edge itself but on the location of the sampling edge relative to a time-band defined by the minimum and the maximum setup times of the flip flops 56 comprising the sampling group for that stage, referred to above as the ensemble sampling time span, and which extends from a minimum set up time $t_{S,MIN}$ to a maximum set up time $t_{S,MAX}$. If the falling edge occurs after all of the flip flops, even those with the longest set up time, have reached a set up condition, the flip flops will all agree.

The set up time $t_s$ (which spans setup time—minimum and maximum) is not triggered by a transition (is not a result of the signal transition) but is rather a requirement. Among the nine flip flops there may be a flip flop which requires the data to be stable for a very long time prior to the sampling edge (REF transition)—this time is denoted $t_{s,max}$. This may also be a flip flop that is still sensitive to change of data values up to $t_{s,min}$ prior to the REF transition, so no signal triggers set up time—this time denotes a stable data guard-band required by the flip flop structure. One might say that the flip flop is insensitive to any change of data that occurs too close to the sampling edge (rise of REF signal)—post the required setup time.

In the example, to shorten the distance between the two clock signal edges, the reference signal REF must be delayed. Since all of the flip flops have voted "1" (unanimously) the multiplexer 70 in the reference signal branch or lower branch will introduce an additional delay by the delay element 66 on the reference signal or REF signal and hence the outputs VCO_O and REF_O will have the desired edges occur closer in time. The addition of the delay to the reference signal does not necessarily preserve the order of the desired signal edges. The signal edge that occurred earlier when examined by the stage may still occur earlier or may occur later as a result of the delay added by the stage.

It's important to note that the sampling processing itself by the flip flops, as well as the decision processing (counting the votes by the flip flops), takes time. This mean that the edges being considered must be delayed so that they arrive at the respective multiplexers 70 and 72 later than the decision from the majority ruling 60 does—therefore, the additional "wait" time by the wait elements 62 and 64, is introduced. The wait elements 62 and 64 delay the signals by at least the total of the sampling processing and vote counting times. The wait element delays do not change depending on which stage the wait elements are provided in, unlike the delay elements which are scaled for smaller and smaller delays at each stage in the sequence.

In certain aspects, the wait element may delay the signals by even more. The wait element delay includes the following times: 1) The time it takes the flip flops to process what they have sampled, 2) The time it takes for the majority vote to be computed, and 3) The time it takes for the majority decision to propagate to the controls of the multiplexers. But since the delay can only operate on edges that occur in the future (relative to the control signal that operates the multiplexers) and cannot operate on any edge that may have occurred in the past, the wait time has also to delay edges that might be as much advanced (into the past) as the delay that is about to be exerted on them. Hence before applying the selective delay, the edges have to be pushed into the future (relative to this multiplexer control signal). In an alternative implementation, the wait elements can be the same length as the longest required delay. The delay would be the three counts of delay listed as above plus a delay of the first stage. A further alternative is to scale the wait element according to the stage it is in. This would push the delay scaled with the stage.

Let us now turn to a more complicated case, where the sought-after edge of the oscillator signal VCO arrives at the sampling elements 56 in proximity to the sampling edge of the reference signal REF. The flip flops in the sampling ensemble 56 that have a shorter setup time will have completed their setup and will check the signal value prior to the arrival of the oscillator signal edge but the flip flops with longer setup times in the same sampling ensemble 56 will not yet have completed their set up when the signal edge arrives and will only be ready to measure the signal value after the signal edge has passed and has changed the value of the sought after signal. The flip flops in the same sampling ensemble 56 will vote differently on the same signal edge, thereby creating stochastic data.

Figure 4:
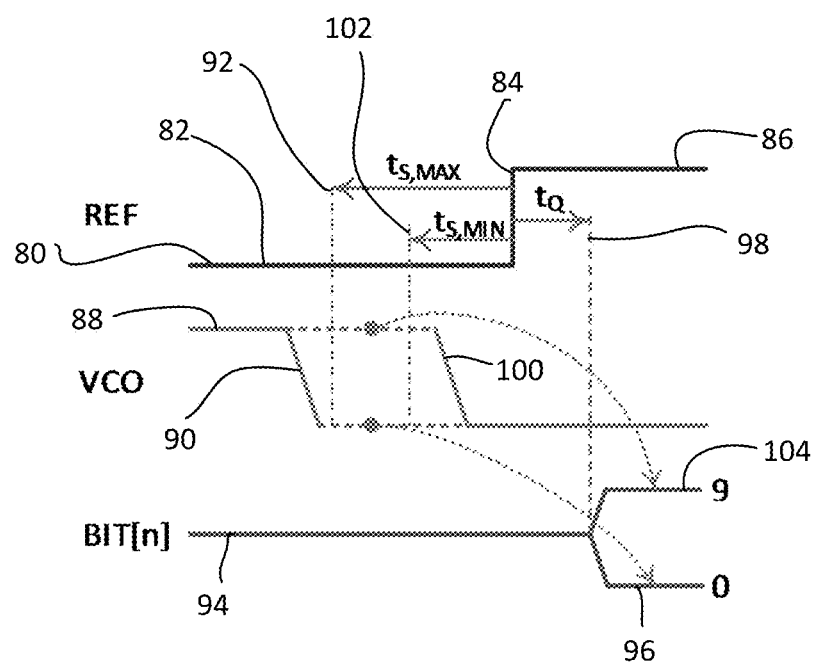
FIG. 4 is a timing digraph showing signals of the sampling stage of a stochastic time-to-digital converter of FIG. 3, where the signals result in a clear-cut decision by the sampling stage.

An example of such situation is depicted in FIG. 4. The signals in FIG. 4 denote two possible states at the input to the flip-flop bunch. In a clear-cut decision case, the transition of the VCO either occurs prior to the required setup time of the slowest flip flop (the one with the longest setup time) in which case all the flip flops get the new VCO data (which is 0 in the case shown) or the transition of the VCO occurs after the required setup time of the fastest flip flop (the one with the minimum setup time requirement)—in this case, neither of the flip flops will be able to sample the new data and all will sample "1"—therefore the outcome of this sampling event will become 9 (assuming the total of 9 FFs employed). In particular, a reference signal 80 (labeled as REF) is a low level 82, or "0", until an edge 84, after which the reference signal 80 is at a high level 86, or "1". Two possibilities are shown for the oscillator signal 88, labeled as VCO. The first is that the falling edge 90 of the oscillator signal 88 occurs before a time $t_{s,Max}$ 92. The oscillator signal will be low or at "0" by the time when the longest set up time for the flip flop elements sense the reference signal edge 84, resulting the voting signal 94, labeled BIT[n], indicating a "0" as shown at 96 after a determination time 98, labeled $t_d$. The time $T_d$ indicates the delay time of the flip flop, namely the time it takes for the sampled data to stabilize at the output of the flip flop. Of course, exactly as with the setup time, it does not need to be equal among the flip flops so td may denote the longest delay in the bunch.

If the reference signal 80 transitions from high to low at an edge 100 which is after the minimum set up time 102, labeled $t_{s,Min}$, the edge 100 will be too close to the edge 84 for the sampling flip flops to have completed their set up time prior at edge 84. The flip flops will still consider the oscillator signal as a high or "1". After the determination time $t_d$, the BIT[n] signal will show all nine flip flops at a "1", as indicated at 104.

The reference signal 80 transitions from low level 82 to high level 86 at the transition edge 84, which is shown at the end of the time period $t_{s,Max}$ to $t_{s,Min}$. The transition edge 84 at the input of the stage may occur earlier. The illustrated transition edge 84 represents when the logic element consider the transition edge after completing a set up time.

If the oscillator down-going transition edge occurs during the time period $t_{s,Max}$ to $t_{s,Min}$, some of the flip flops will read one value and some will read the other value. The number of flip flops in the sampling ensemble 56 that will detect the transitioned signal and switch to "0" will depend on how late in the time period $t_{s,Max}$ to $t_{s,Min}$ the down-going transition of the reference signal arrives. The determination for that stage may be considered as a vote by the sampling elements as determined by majority rule. Alternatively, the vote may serve as a finer division of the measuring interval. For example, for nine sampling elements, a vote of two elements for "0" may be considered as the transition edge having occurred at 2/9 of the interval being examined.

As the signals pass through each stage and the measuring intervals become smaller and smaller, the transition edges being sought will converge toward one another and will generally eventually fall within the time period $t_{s,Max}$ to $t_{s,Min}$, resulting in stochastic data for a stage, particularly if a larger number of stages is provided. This may occur at earlier stages for some signals and at later stages for other signals.

In general, the appearance of stochastic data in a stage may constitute the end of the successive approximation for the converter. Information from the subsequent stages may not be required. At the time of encoding (processing of the votes to form a code), the stochastic data created here will be translated into fine grating and data from subsequent stages nullified See a detailed explanation of the encoder operation below.

Several special cases must be considered. There might be one or a small number of outlying samplers within the group or ensemble. The outliers would be flip flops that have significantly different set-up time from the rest of the group. In this case, these flip flops could vote against (differently from) the group although the edges are in fact still quite distant. The votes of any outliers will be overrun by the majority ruling so that the majority would provide a correct decision as to the time of the edge propagation. For this instance, the stochastic data created by sampling with a sampling ensemble that includes outliers must be disregarded. This can be easily achieved by setting an encoding threshold for the sampling ensemble. For example, only the cases that feature between 2 and 8 similar votes of a nine sampling element stage will be considered to have stochastic data, thereby nullifying the decisions taken at subsequent stages. In essence, the outliers are ignored.

The more troublesome kind of disagreement among the sampling elements is caused by metastability. Due to the proximity of the edges to one another, one or more of the flip flops may not reach a conclusion (its output is still in between digital levels) by the time the vote of that flip flop needs to be counted. The flip flop output between digital "0" and "1" values is referred to as a metastability. In this case, the majority ruling overrules the metastable output and provides a result for the stage in determining precedence for the application of the delay. Of course, by the time decoder needs to operate on the output of the stages, the matastability would be long over and the value of the flip flop outputs settled at either a 1 or 0, hence the decoder logic will not be contaminated with non-digital values. Once more, the decision whether to treat the stochastic data or not will be thresholded as before.

By the time, the oscillator signal VCO and reference signal REF edges reach the last stage, the distance between the two edges is minimized to below the smallest delay (the delay introduced by the next to last stage, where n=1). Hence, the last stage (n=0) only features the sampling ensemble—which may be designed to cover at least the time span of that smallest delay. Therefore, the data of the last stage will always be treated as stochastic.

Figure 5:
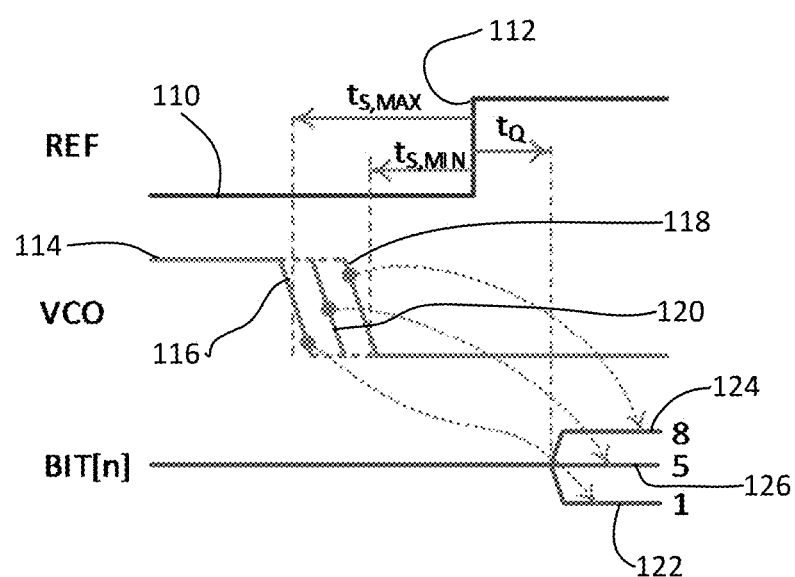
FIG. 5 is a timing digraph showing signals of the sampling stage of a stochastic time-to-digital converter of FIG. 3, wherein the signals result in stochastic data by the stage.

Turning to FIG. 5, the reference signal 110 has a transition edge 112. The oscillator signal 114 has a transition edge that occurs within the time frame $t_{s,Max}$ to $t_{s,Min}$. In the first example, the transition edge 116 is near the $t_{s,Max}$ end of the time frame, resulting in most flip flops processing the signal as a "0" as shown at 122. If the oscillator transition is near the $t_{s,Min}$ end of the time frame, most of the sampling elements will output a "1" as shown at 124. If the signal transition 120 occurs in the middle of the time frame, the outputs of at least some of the sampling elements may be at an intermediate value, or metastable value, as indicated at 126.

Figure 6:
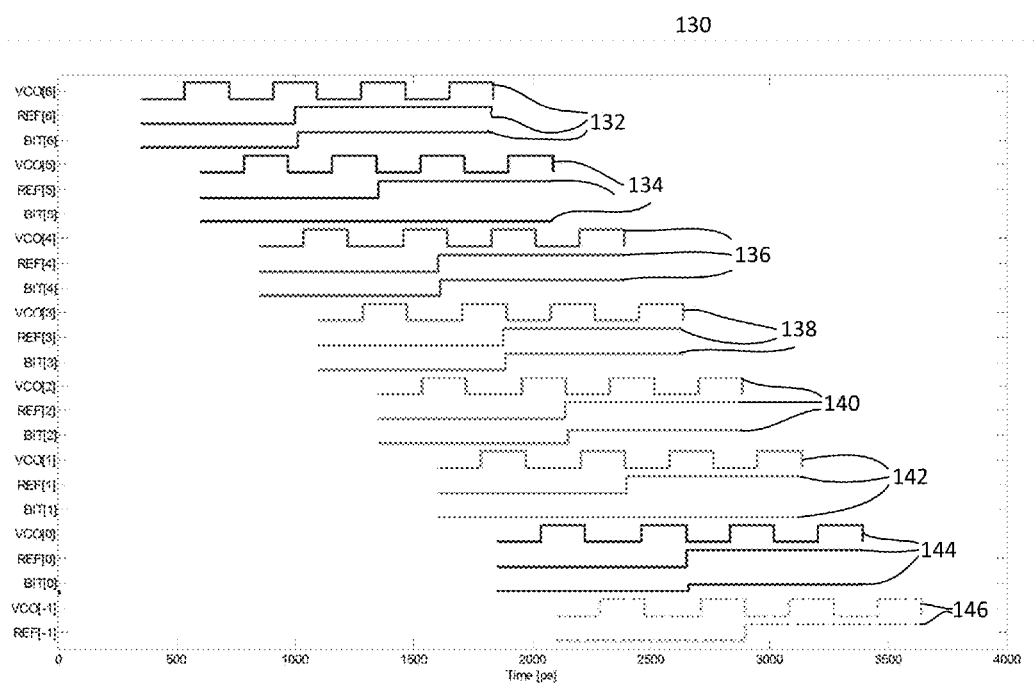
FIG. 6 is a timing digraph showing signals of a multiple stage binary stochastic time-to-digital converter, including seven stages in the example.

A diagram in FIG. 6 shows an exemplary timing diagram 130 of a 7-stage binary stochastic time-to-digital converter. A first set of signals 132 are the oscillator signal VCO[6], reference signal REF[6], and output signal BIT[6] for the first stage, denoted [6]. The second set of signals 134 are the oscillator signal VCO[5], reference signal REF[5], and output signal BIT[5] for the second stage, denoted [5]. Similar signal sets are provided for the third stage [4] 138, fourth stage [3] 140, fifth stage [2] 142, sixth stage [1] 144, and seventh stage [0] 146.

We can see that by stage n=2 in signal set 140 (the region is circled) the distance between the rising edge of REF and the falling edge of VCO has become sufficiently small for BIT[2] to become different from both 0 and 9 and hence feature a stochastic data.

One more issue to be addressed is the issue of wrong edge proximity. The issues stems from the fact that when the votes cast by the sampling ensemble 56 adhere to the definition of stochastic data (as above), it's impossible to infer whether the sampling ensemble has encountered the desired edge (falling edge in the example above) or the other edge (rising edge). Moreover, due to a possible metastability, the data accumulated in subsequent stages may be wrong, and cannot be employed to decide whether a falling or rising edge was sensed. The expected output of the time-to-digital converter would be different in depending on whether a rising or falling edge is encountered. A possible mitigation strategy of this issue is as follows:

First, the wrong edge issue can be constrained to the first stage by making the first delay smaller than the smallest part of the oscillator signal VCO cycle. The oscillator signal may have a 50 percent duty cycle with equal length "0" and "1" values or may have some other duty cycle with longer high or low values. The high and low are not assumed to be of equal size, the effective duty-cycle can be different than 50%. This would still avail more than adequate dynamic range since the sum of delays in this case will amount to almost a full cycle and since the delay can be applied on either the reference signal REF or the oscillator signal VCO. The effective dynamic range is almost twice the full cycle (−T_VCO,+T_VCO). If the wrong oscillator signal VCO edge was close to the reference signal REF sampling edge but not enough to cause stochastic data, it would be bumped away by a delay so large that the correct edge becomes the closest, so that the situation will never repeat itself and the convergence of the distance between the desired edges will become as described above.

If the wrong edge is close enough to create stochastic data, the rest of the decisions by the following stages are worthless. The time-to-digital converter may still provide correct operation the device assigns this situation a code that maintains monotonicity. For instance, if the proximity of the correct edge results in output codes close to 0, the situation of wrong code must be given a value at either the highest or the lowest edge of the code range. The codes assigned to different time distances will not be kept continuous but will unavoidably remain monotonic. The introduced non-linearity can be compensated for by calibration that may be performed anyways to get rid of integral non-linearity. A simple edge detector 78 can be used here to signal whether the stage has encountered a wrong edge. This information can be used as a decoder pre-processing in order to force the resulting code to the correct value.

Figure 7:
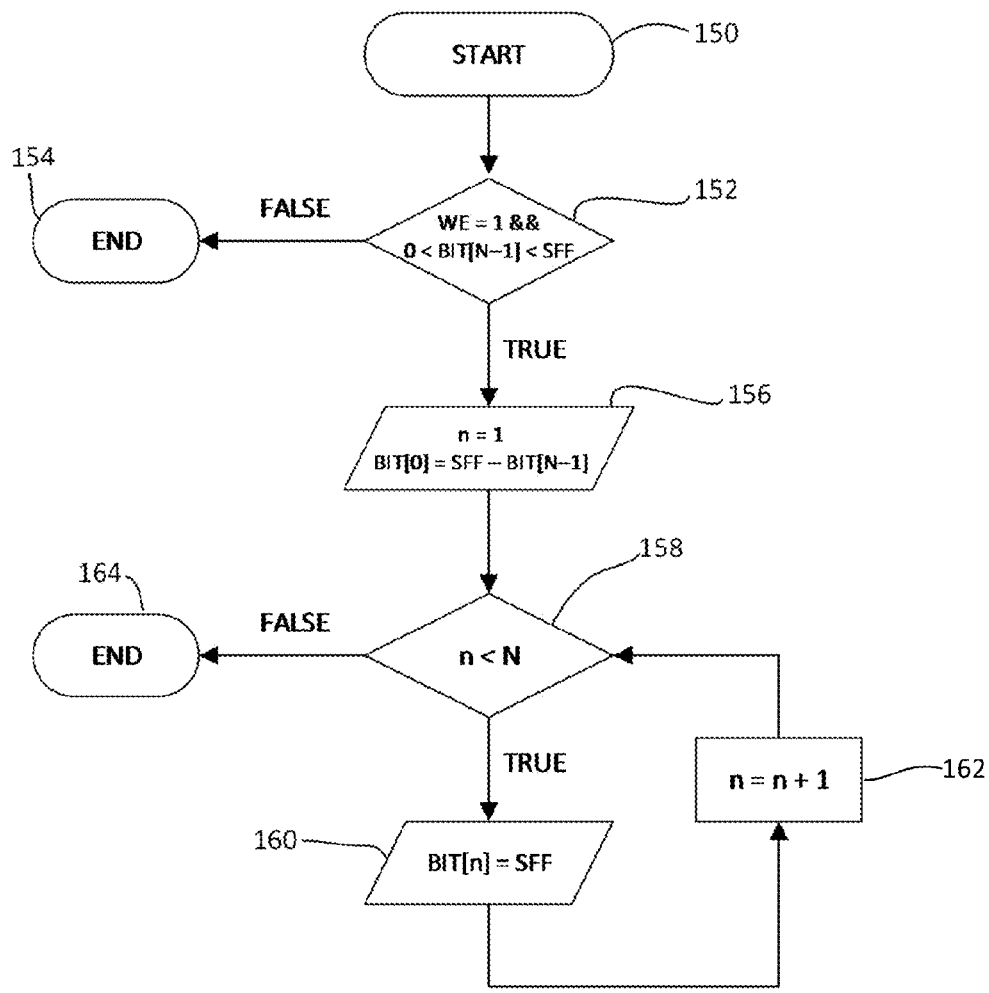
FIG. 7 is a flow chart of pre-processing steps for a binary stochastic time-to-digital converter.

A possible pre-processing scheme is shown in FIG. 7.

An implementation of an encoder is shown in the flowchart in FIG. 7. A start 150 to the process is followed by a decision 152 which determines if the wrong edge (WE) is being detected and (&&=logical AND) if the results voting by the logic flip flops (BIT[N−1]) has a value between 0 and stochastic flip flops (SFF). If an outlier flip flop value appears in the voting, it is discarded by counting N−1 votes. If the decision is false, the process is ended at 154. If the decision 152 is true, then a step 156 for the first stage (n=1) sets the value BIT[Q]=SFF−BIT[N−1]. At step 158 a determination is made as to whether the process is at the last stage. If so the process ends at step 162. If not, step 160 looks at the voting value BIT[n]=SFF to determine if the voting is stochastic. At step 162, the process advances to the next stage, setting n=n+1 and the process goes back to the decision 158. In this way, each stage is examined to determine if the logic elements for that stage are stochastic, and if so the process is stopped.

Figure 8:
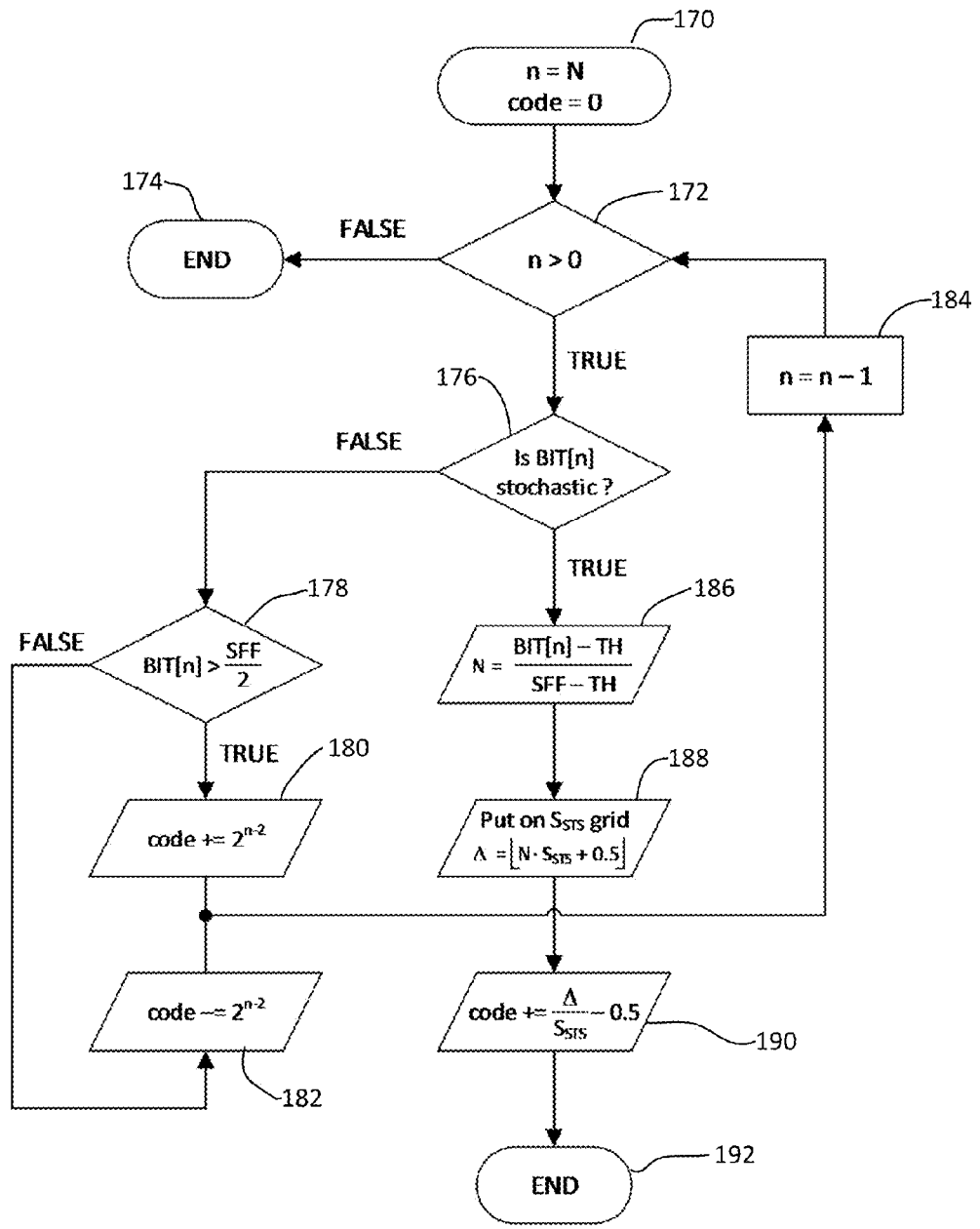
FIG. 8 is a flow chart of steps for a possible encoder implantation.

FIG. 8 shows the output of the encoder, for different distance between the reference signal REF sampling edge and the oscillator signal VCO falling edge for a 6-bit time-to-digital converter. Ensemble delay decisions are mapped to integers and stochastic states are represented as fractions. In particular, a step 170 sets initial values. At decision 172, if the process has counted down to the last stage where n=0 then the process is ended at 174. If not at the last stage the step 176 determines if the logic element outputs are stochastic. If not, the step 178 looks at the voting to determine if it is a majority. If not, the step 182 is performed and the value of n is incremented at 184 and the process returns to step 172. If the decision at 178 is true, the process 180 is performed and the value of n is incremented at 184 before returning to step 172.

If the decision at 176 is true indicating that the logic gates are stochastic, the process 186 is performed to apply a threshold TH, the process 188 is performed, the process 190 is performed and then the process is ended at 192. The person of skill in the art will understand from the math presented that delays of half prior delays are added at each stage to the earlier signal.

Figure 9:
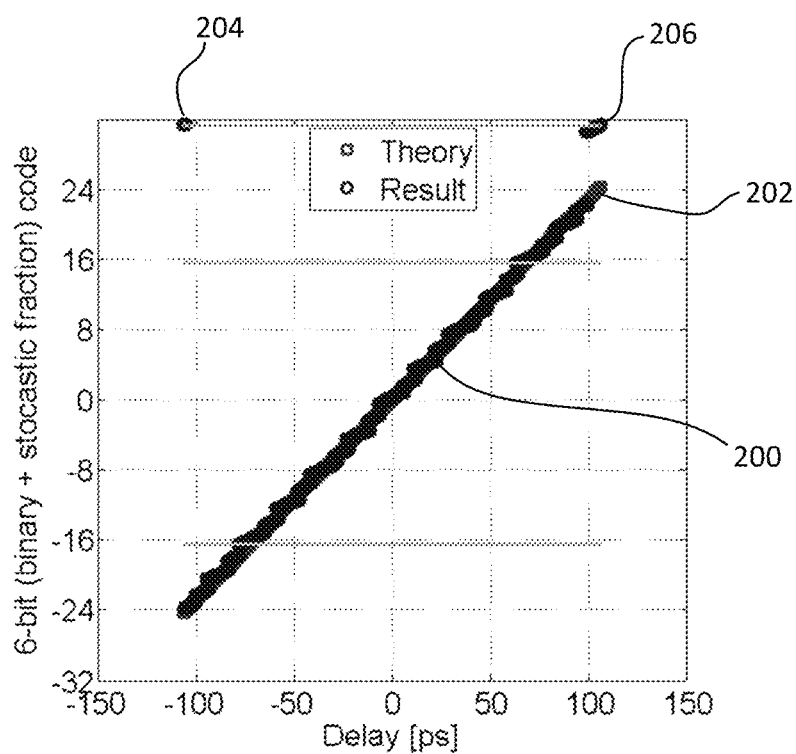
FIG. 9 is a graph showing an output of a binary stochastic time-to-digital converter device compared to theoretical values for a time-to-digital converter device.

FIG. 9 is a graph that shows that actual results 200 (shown as a slightly zig-zag line) track closely to theoretical values 202 (shown as a straight line) for the present apparatus and method. The values 204 and 206 show the results where a wrong edge has been detected.

The present time-to-digital converter combines the measurement and decision functions in the stages.

Examples of delays introduced by the stages include a first stage having a 200 picosecond delay, a second stage having a 100 picosecond delay, etc. Another example provides a first stage with a 50 picosecond delay, a second stage with a 25 picosecond delay, etc. In an example, the flip flops may have a 1.5 to 1.8 picosecond range in the set up time using standard deviation. The sum of the set up times may be 4 picoseconds plus or minus 2 picoseconds. An 8 picosecond range may provide the standard deviation of 66% of the values with a 1.2 to 2 picosecond value. Signals that are 1.5 picosecond apart may be too close to call.

In an example, the decoder has twelve flip flops per stage. Another example may have five flip flops per stage, while yet other examples may have 20 flip flops per stage.

The output of a stage may only be trusted if the votes are unanimous, or unanimous minus any outliers. The first stage that is stochastic may halt the further processing by subsequent stages.

An outlier may be a flip flop with a 10 picosecond set up time when others in the ensemble set up within a 4 picosecond band.

The decoder output may be an indication of time or an indication of the phase difference between the signals. A converter may be provided to convert time into phase. A wrong edge detector may determine if the signal is at 0 phase or at 2n.

EXAMPLES

Example 1 is an apparatus for determining a time difference between two signals, comprising: a plurality of stages connected in a sequence of stages, each of the stages including first and second inputs for receiving the two signals, each stage that has a next following stage in the sequence having two outputs for outputting the two signals to the following stage, each stage having an encoder output, each stage being operable to determine which of the two signals has an earlier transition edge and being operable to apply a delay to the signal that has been determined to have the earlier transition edge, the determination by the stage being output from the encoder output of the respective stage as a stage value signal; and an encoder having a plurality of inputs and an output, the plurality of inputs of the encoder being connected to respective ones of the encoder outputs of the stages, the encoder being operable convert the stage value signals into a time difference signal.

Example 2 is the subject matter of Example 1, wherein the delay applied by each stage in the sequence of stages is a smaller delay than the delay applied by the preceding stage in the sequence.

Example 3 is the subject matter of Example 2, wherein the delay applied by each of the stages is half of the delay applied by the preceding stage in the sequence.

Example 4 is the subject matter of Example 1, wherein each of the stages in the sequence transmits the two signals to a next following stage, one of the two transmitted signals being delayed by the amount of the delay applied by the respective stage.

Example 5 is the subject matter of Example 1, wherein each of the stages includes a plurality of logic elements, each of the logic elements of a stage being configured to receive the two signals, each of the logic elements being operable to output a logic signal that indicates which of the two signals has an earlier transition edge.

Example 6 is the subject matter of Example 5, wherein the delay is applied to the signal of the two signals that has the earlier transition edge as determined by a majority vote of the logic signals of the plurality of logic elements for the respective stage.

Example 7 is the subject matter of Example 1, wherein each stage but the last stage in the sequence of stages is operable to determine an earlier of the two signals and to apply a delay to the signal determined to have an earlier transition edge.

Example 8 is a method for determining a time difference between two signals, comprising: first determining which signal of a first signal and a second signal has an earlier occurring edge; first delaying the signal of the first signal and the second signal having an earlier occurring edge by a first delay time to provide first delayed first and second signals; second determining which signal of the first delayed first and second signals has an earlier occurring edge; second delaying the signal of the first delayed first and second signals having an earlier occurring edge by a second delay time to provide second delayed first and second signals, the second delay time being less than the first delay time; third determining which signal of the second delayed first and second signals has an earlier occurring edge; third delaying the signal of the second delayed first and second signals having an earlier occurring edge by a third delay time to provide third delayed first and second signals, the third delay time being less than the second delay time; further determining and further delaying in accordance with the foregoing; outputting a value for each determining; and encoding the values of the determinings as a digital value indicating a time difference between the first and second signals.

Example 9 is the subject matter of Example 8, wherein each determining includes a plurality of sub-determinings.

Example 10 is the subject matter of Example 9, wherein the value for each determining includes a majority vote of the sub-determinings of the respective determining.

Example 11 is the subject matter of Example 9, further comprising: discarding an outlier of the sub-determinings for at least one determining.

Example 12 is the subject matter of Example 8, wherein the first determining and the first delaying are performed in a first stage; wherein the second determining and the second delaying are performed in a second stage; wherein the third determining and the third delaying are performed in a third stage; and wherein the further determining and further delaying are performed in a further stage.

Example 13 is a time-to-digital converter, comprising: a first stage having a wrong edge detector configured to receive a first signal, the first stage having a plurality of first logic elements configured to receive the first signal and a second signal, the first stage being operable to determine which of the first and second signals has an earlier occurring signal edge, the first stage being operable to calculate a majority vote of outputs of the first logic elements, the first stage applying a first delay to the signal of the first and second signals having the earlier occurring edge as determined by the majority vote, the first stage outputting the signal with the first delay and the other signal without a delay as a first stage output; a second stage having a plurality of second logic elements configured to receiving the first stage output, the second stage being operable to determine which of the first and second signals of the first stage output has an earlier occurring signal edge, the second stage being operable to calculate a majority vote of outputs of the second logic elements, the second stage applying a second delay to the signal of the first stage output having the earlier occurring edge, the second stage outputting the signal with the second delay and the other signal without a delay as a second stage output; at least one further stage having features corresponding to the second stage; and an encoder receiving output signals from the logic elements of each of the stages, the encoder being operable to generate a value indicative of a time difference between the two signals.

Example 14 is the subject matter of Example 13, wherein the second delay is half of the first delay.

Example 15 is the subject matter of Example 14, wherein the first and second and at least one further stage are connected in a sequence, and where in the delay applied by each stage is half of a delay applied by a next prior stage in the sequence.

Example 16 is the subject matter of Example 13, wherein the logic elements of each of the stages are D flip flop logic elements.

Example 17 is the subject matter of Example 13, wherein the first stage includes a wrong edge detector.

Example 18 is the subject matter of Example 13, wherein each stage includes first and second wait elements configured to delay the respective first and second signals for a time sufficient to obtain the majority vote and establish the vote at a switch.

Example 19 is the subject matter of Example 13, wherein each stage includes first and second multiplexers configured to transmit a delayed signal or to transmit a non-delayed signal depending on the majority vote.

Example 20 is the subject matter of Example 13, wherein the encoder is operable to disregard stage outputs in the sequence after a stage outputs a stochastic stage output having different output values from the logic elements within the stage.

Example 21 is a time-to-digital converter, comprising: a first stage receiving first and second signals, the first stage including: a plurality of first determining means for determining which signal of the first and second signals has an earlier edge transition; a first majority vote means for calculating a majority vote of the first determining means; a first delay means for applying a first delay to the signal determined to be earlier by the first majority vote means; a second stage receiving the first and second signals from the first stage, the second stage including: a plurality of second determining means for determining which signal of the first and second signals has an earlier edge transition; a second majority vote means for calculating a majority vote of the second determining means; a second delay means for applying a second delay to the signal determined to be earlier by the second majority vote means; and an encoder configured to receive outputs of the first and second determining means and operable to generate a value indicative of a time difference between the first and second signals.

Example 22 is the subject matter of Example 21, further comprising a switch means in each of the first and second stages, the switch means transmitting either the delayed first signal or the non-delayed second signal or transmitting the non-delayed first signal and the delayed second signal depending on the majority vote.

Example 23 is an apparatus comprising means to perform the method as described in any of Examples 8-12.

Example 24 is a computer program product embodied on a computer-readable medium comprising program instructions, when executed, causes a processor to perform the method of any of Examples 8-12.

Example 25 is an apparatus substantially as shown and described.

Example 26 is a method substantially as shown and described.

CONCLUSION

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

We claim:

1. An apparatus for determining a time difference between two signals, comprising:
   a plurality of stages connected in a sequence of stages, each of the stages including first and second inputs for receiving the two signals, each stage that has a next following stage in the sequence having two outputs for outputting the two signals to the following stage, each stage having an encoder output, each stage being operable to determine which of the two signals has an earlier transition edge and being operable to apply a delay to the signal that has been determined to have the earlier transition edge, the determination by the stage being output from the encoder output of the respective stage as a stage value signal; and
   an encoder having a plurality of inputs and an output, the plurality of inputs of the encoder being connected to respective ones of the encoder outputs of the stages, the encoder being operable convert the stage value signals into a time difference signal.

2. The apparatus as claimed in claim 1, wherein the delay applied by each stage in the sequence of stages is a smaller delay than the delay applied by the preceding stage in the sequence.

3. The apparatus as claimed in claim 2, wherein the delay applied by each of the stages is half of the delay applied by the preceding stage in the sequence.

4. The apparatus as claimed in claim 1, wherein each of the stages in the sequence transmits the two signals to a next following stage, one of the two transmitted signals being delayed by the amount of the delay applied by the respective stage.

5. The apparatus as claimed in claim 1, wherein each of the stages includes a plurality of logic elements, each of the logic elements of a stage being configured to receive the two signals, each of the logic elements being operable to output a logic signal that indicates which of the two signals has an earlier transition edge.

6. The apparatus as claimed in claim 5, wherein the delay is applied to the signal of the two signals that has the earlier transition edge as determined by a majority vote of the logic signals of the plurality of logic elements for the respective stage.

7. The apparatus as claimed in claim 1, wherein each stage but the last stage in the sequence of stages is operable to determine an earlier of the two signals and to apply a delay to the signal determined to have an earlier transition edge.

8. A method for determining a time difference between two signals, comprising:
    first determining which signal of a first signal and a second signal has an earlier occurring edge;
    first delaying the signal of the first signal and the second signal having an earlier occurring edge by a first delay time to provide first delayed first and second signals;
    second determining which signal of the first delayed first and second signals has an earlier occurring edge;
    second delaying the signal of the first delayed first and second signals having an earlier occurring edge by a second delay time to provide second delayed first and second signals, the second delay time being less than the first delay time;
    third determining which signal of the second delayed first and second signals has an earlier occurring edge;
    third delaying the signal of the second delayed first and second signals having an earlier occurring edge by a third delay time to provide third delayed first and second signals, the third delay time being less than the second delay time;
    further determining and further delaying in accordance with the foregoing;
    outputting a value for each determining; and
    encoding the values of the determinings as a digital value indicating a time difference between the first and second signals.

9. The method as claimed in claim 8, wherein each determining includes a plurality of sub-determinings.

10. The method as claimed in claim 9, wherein the value for each determining includes a majority vote of the sub-determinings of the respective determining.

11. The method as claimed in claim 9, further comprising: discarding an outlier of the sub-determinings for at least one determining.

12. The method as claimed in claim 8, wherein the first determining and the first delaying are performed in a first stage; wherein the second determining and the second delaying are performed in a second stage; wherein the third determining and the third delaying are performed in a third stage; and wherein the further determining and further delaying are performed in a further stage.

13. A time-to-digital converter, comprising:
    a first stage having a wrong edge detector configured to receive a first signal, the first stage having a plurality of first logic elements configured to receive the first signal and a second signal, the first stage being operable to determine which of the first and second signals has an earlier occurring signal edge, the first stage being operable to calculate a majority vote of outputs of the first logic elements, the first stage applying a first delay to the signal of the first and second signals having the earlier occurring edge as determined by the majority vote, the first stage outputting the signal with the first delay and the other signal without a delay as a first stage output;
    a second stage having a plurality of second logic elements configured to receiving the first stage output, the second stage being operable to determine which of the first and second signals of the first stage output has an earlier occurring signal edge, the second stage being operable to calculate a majority vote of outputs of the second logic elements, the second stage applying a second delay to the signal of the first stage output having the earlier occurring edge, the second stage outputting the signal with the second delay and the other signal without a delay as a second stage output;
    at least one further stage having features corresponding to the second stage; and
    an encoder receiving output signals from the logic elements of each of the stages, the encoder being operable to generate a value indicative of a time difference between the two signals.

14. The time-to-digital converter as claimed in claim 13, wherein the second delay is half of the first delay.

15. The time-to-digital converter as claimed in claim 14, wherein the first and second and at least one further stage are connected in a sequence, and where in the delay applied by each stage is half of a delay applied by a next prior stage in the sequence.

16. The time-to-digital converter as claimed in claim 13, wherein the logic elements of each of the stages are D flip flop logic elements.

17. The time-to-digital converter as claimed in claim 13, wherein the first stage includes a wrong edge detector.

18. The time-to-digital converter as claimed in claim 13, wherein each stage includes first and second wait elements configured to delay the respective first and second signals for a time sufficient to obtain the majority vote and establish the vote at a switch.

19. The time-to-digital converter as claimed in claim 13, wherein each stage includes first and second multiplexers configured to transmit a delayed signal or to transmit a non-delayed signal depending on the majority vote.

20. The time-to-digital converter as claimed in claim 13, wherein the encoder is operable to disregard stage outputs in the sequence after a stage outputs a stochastic stage output having different output values from the logic elements within the stage.

\* \* \* \* \*